US006246055B1

(12) United States Patent
Koops et al.

(10) Patent No.: US 6,246,055 B1
(45) Date of Patent: Jun. 12, 2001

(54) PHOTON DETECTOR AND PROCESS FOR MAKING THE SAME

(75) Inventors: Hans Wilfried Peter Koops, Ober-Ramstadt; Alexander Kaya, Damrstadt, both of (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/194,311
(22) PCT Filed: May 21, 1997
(86) PCT No.: PCT/EP97/02576
  § 371 Date: Nov. 24, 1998
  § 102(e) Date: Nov. 24, 1998
(87) PCT Pub. No.: WO97/45710
  PCT Pub. Date: Dec. 4, 1997

(30) Foreign Application Priority Data

May 24, 1996 (DE) .............................. 196 21 175
May 20, 1997 (DE) .............................. 197 20 926

(51) Int. Cl.[7] .............................. G01J 1/42; H01L 31/036
(52) U.S. Cl. .................... 250/336.1; 250/338.1; 356/51
(58) Field of Search .............................. 250/336.1, 338.1, 250/338.4, 339.02, 361 R, 367, 370.01, 370.08, 370.11, 370.12, 370.14, 372; 356/51

(56) References Cited

U.S. PATENT DOCUMENTS 5,446,286 * 8/1995 Bhargava ........................ 250/361 R
5,759,230 * 6/1998 Chow et al. ........................ 75/362

FOREIGN PATENT DOCUMENTS 4234671   4/1994  (DE) .

OTHER PUBLICATIONS

L. Strueder, J. Kemmer, "Neuartige Roentgendetektoren fur die Astrophysik", Phys. Bl. 52 (1996) 21.

J.C. Gammel, H. Ohno, J.M. Ballantyne, "High–Speed Photoconductive Detectors Using GaInAs", IEEE J. Quant. Electr. QE–17 (9181) pp. 269–272.

J. B. Pendry;, "Photonic Band Structures", Journal of Modern Optics, vol. 42, No. 2, (Feb. 1994), pp. 209.

\* cited by examiner

*Primary Examiner*—Constantine Hannaher
*Assistant Examiner*—Albert Gagliardi
(74) *Attorney, Agent, or Firm*—Milde Hoffberg & Macklin, LLP

(57) ABSTRACT

In a photon detector wherein material of light-dependent conductivity is disposed between electrically conductive connections, the material is nanocrystalline composite material, said nanocrystalline composite material, in the process of making it, being applied to a substrate by corpuscular-beam-induced deposition, organo-metallic compounds being used as starting materials, said organo-metallic compounds being adsorbed on the surface of the substrate owing to their high vapor pressure.

11 Claims, 1 Drawing Sheet

PHOTON DETECTOR AND PROCESS FOR MAKING THE SAME

BACKGROUND OF THE INVENTION

The invention relates to a photon detector wherein material of light-dependent conductivity is disposed between electrically conductive connections; the invention further relates to a process for the manufacture of this photon detector.

A wide range of different devices is known for the detection of light or photons, such as photocells, in which, in a high-vacuum vessel, the photons cause the emission of electrons from a photocathode, or solid-state elements, in which a light-dependent resistance value is converted into electrical signals. Examples of known photon detectors are described, inter alia, in *Photonendetektoren für UV* L. Ströder, J. Kemmer, "Neuartige Detektoren für die Röntgen-Astrophysik," *Phys. Bl.* 52 (1996) 21, "MOS-CCD-Kameras der Elektronik-Industrien", company catalogues and in *Photo-Widerstände aus Halbleitermaterial*: J. C. Gammel, H. Ohno, J. M. Ballantyne, "High Speed Photoconductive detectors using GaInAs". *IEEE J. Quant. Electr.* QE-17 (1981) 269–272. Some of the known devices react sluggishly to the incidence of light, require high light intensities or are expensive to manufacture. Furtheron from U.S. Pat. No. 5,446,286 a very fast sensor is known which uses doped nanocrystallites. However the required photosensitivity is achieved only for X-rays and UV-rays. Further in the German Patent No. DE 42 34 671 the manaufacturing of networks of nanocrystallites is described which are designated for different sensors whereby the nanocrystallites are not insolated against each other. A usable photosensitivity is not achieved.

SUMMARY OF THE INVENTION

A object of the present invention is to indicate a photon detector that produces evaluatable signals in the case of even small quantities of light and that can be manufactured by simple processes.

This object as well as other objects of the invention which will become apparent in the discussion that follows are achieved in that the material is nanocrystalline composite material. Preferably, it is provided that the nanocrystalline composite material is formed from segregated noble-metal single crystals, said noble-metal single crystals being embedded in a matrix of material of low conductivity and/or that the single crystals have a size of only a few nanometers.

The photon detector according to the invention has the advantage that its manufacture requires no special base material with semiconductor properties, such as extremely pure silicon. Nor is it necessary to employ high-accuracy lithography techniques. The nanocrystalline composite material can be applied to any insulating substances, such as quartz. All that is required is a conductive connection structure in order to measure the current induced by photons. Apart from that, there is no need for several of the process stages required in semiconductor technology, this making it considerably cheaper to manufacture the photon detectors according to the invention.

Nanocrystalline composite material is described for example in: J. B. Pendry, *Journal of Modern Optics*, Vol. 42, No. 2 (February 1994), 209.

Even minute quantities of the composite material are sufficient in order to detect photons. Thus, for example, a photon detector according to the invention was manufactured for experimental purposes, the nanocrystalline composite material having the form of a wire of 2 $\mu$m length and a cross section of 100 nm×100 nm. Dimethyl gold trifluoroacetyl acetonate was used as the starting material for deposition. The thus manufactured photon detector according to the invention indicated a photon flux as small as that emitted by a 60-watt light bulb at a distance of one meter. Larger-area detectors of 2 $\mu$m×2 $\mu$m size made of platinum-containing material exhibit similar changes in conductivity.

One of the effects of the manufacturing process according to the invention is that the single crystals comprise a zero-dimensional electron gas with heavily quantized energy gaps.

In the process according to the invention for the manufacture of the photon detector, it is provided that the nanocrystalline composite material is applied to a substrate by corpuscular-beam-induced deposition, organo-metallic compounds being used as starting materials, said organo-metallic compounds being adsorbed on the surface of the substrate owing to their high vapor pressure. In particular, the single crystals are formed in that the layers of organo-metallic compounds adsorbed on the surface of the substrate with a molecular-beam apparatus in a vacuum are converted into nanocrystalline compounds by high-energy bombardment with corpuscular beams.

Preferably, it is provided in the process according to the invention that, during bombardment, the temperature of the substrate is between 0° C. and 100° C. and/or that the organo-metallic compound contains a noble metal, preferably platinum or gold. Particularly good results are obtained with the process according to the invention if high-energy electron beams are used as corpuscular beams.

Sample embodiments of the invention are explained in greater detail in the following description and are presented in the drawings.

DESCRIPTION OF THE PREFERRED EMBODIMENTS

Figure 1:
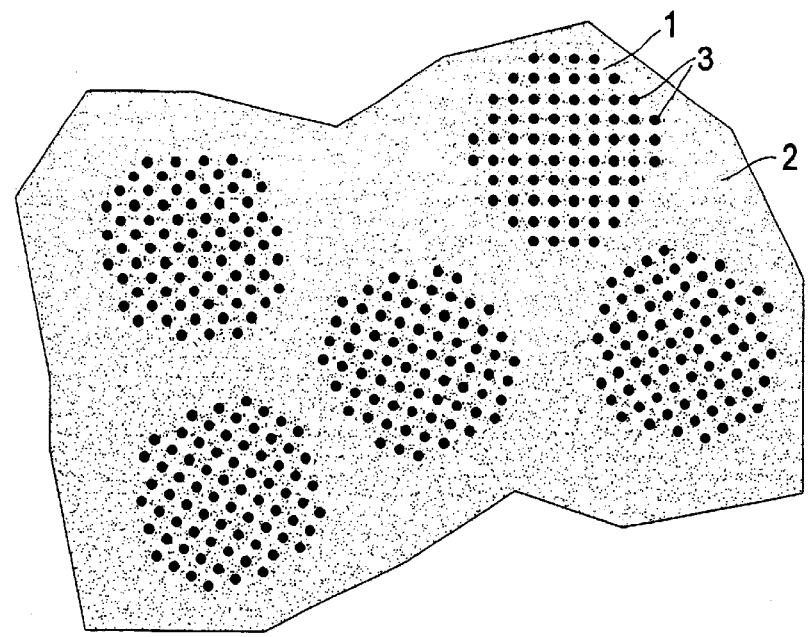
FIG. 1 is a schematic representation of a plurality of single crystals within the nanocrystalline composite material.

FIG. 1 is a schematic representation of nanocrystalline composite material of the kind used in the photon detector according to the invention. For the sake of clarity, the representation has been greatly simplified, for example in that only one plane is shown and in that one crystal plane of all the single crystals represented is in that plane, which is not the case in reality.

Layers of organo-metallic compounds are applied by corpuscular-beam deposition to the surface of a substrate not shown in FIG. 1. By means of high-energy local or large-area bombardment with corpuscular beams of high energy density, said organo-metallic compounds are converted into nanocrystalline substances, the substrate being at room temperature or also at an increased temperature of, for example, 100° C. The increase in temperature causes the intensified evaporation of organic radicals, which are produced from the organo-metallic compounds in the course of molecular disintegration and which, consequently, are included to a reduced extent in the layer of the nanocrystalline substance.

This results in particularly conductive single crystals 1 with a specific resistance close to that of the pure metal. The single crystals have a diameter of between 1 nm and 4 nm and consist, for example, of 600 atoms, which are represented as black dots 3 in FIG. 1. The single crystals 1 are embedded in a matrix 2 which is formed of organic radicals and is virtually not conductive.

The single crystals comprise a zero-dimensional electron gas with (owing to the quantum conditions for electron eigenstates in the nanocrystallites) heavily quantized energy states of defined energy gaps. Because of the size of the nanocrystallites and because of the gaps between them, there is, according to Mott's theory, an activation energy for the migration of the electrons by NNH (nearest neighbor hopping) of the electrons necessary, said activation energy being greater than the energy of 27 meV available at room temperature of 20° C. In the case of gold compounds, the activation energy is between 20 meV and 60 meV and is therefore, depending on type, less than or also greater than the excitation energy at room temperature, whereas, in the case of platinum-containing crystalline composites, the activation energy is between 120 meV and 240 meV, depending on the conditions of manufacture. According to the theory of electron conduction by VRH (variable range hopping), the conductivity measured at different temperatures follows an exponential law $G = a \cdot T^{-\frac{1}{2}}$. Such nanocrystalline metals with non-conductive matrix do not occur naturally, but are produced under the special conditions of corpuscular-beam-induced deposition.

The photon detector according to the invention may be considered as supercooled matter, since photons of room temperature do not have sufficient energy to excite the electrons. This is not possible in the zero-dimensional electron gas of the nanocrystallites because of the large energy gaps >27 meV, which are particularly large in the range of the low excitation states.

Figure 2:
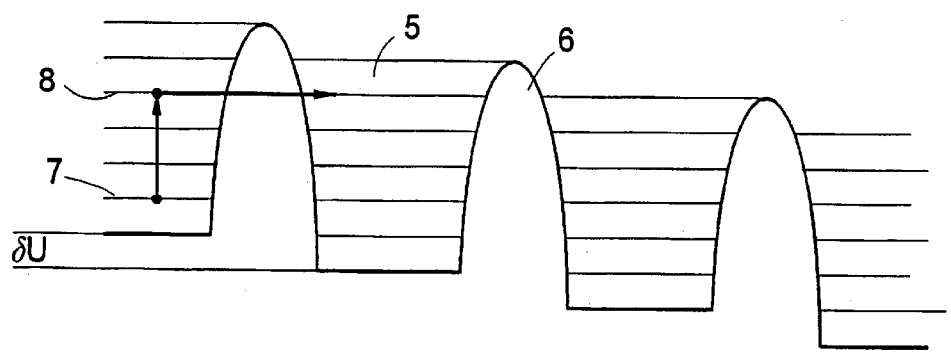
FIG. 2 is a schematic representation of the electron energy levels in the crystallites, serving to explain the origin of the photon-dependent current.

Conversely, infrared-radiation photons have more than 500 meV of energy and are therefore easily able to elevate the electrons to higher-energy states, this being indicated by the vertical arrow in FIG. 2. The electrons in these bands have orbitals of larger spatial extent than those of lower energy and it is therefore easy to move the highly excited electrons to nearest neighbors through the application of a low voltage $\delta U$ and thus to obtain the photoelectric current or voltage drop at constant current.

The effect can equally be explained in that the potential wells 5 (FIG. 2) of the nanocrystallites are rounded off towards the vacuum or towards the neighbor by the image force in the tunnel effect. Consequently, electrons from higher-energy states (for example 8) need tunnel only through a narrower potential barrier 6 to the neighboring well than is the case for more strongly bound electrons (for example 7), which explains the increased tunnel current. Consequently, the nanocrystalline composite materials represent a new class of low-noise photon detectors which can be manufactured under particularly simple conditions of production and which do not require high-purity semiconductor material as the starting substance.

The nanocrystalline composite materials can be applied to all insulating substances, such as glass, quartz or plastics, by corpuscular-beam-induced deposition. The latter can be produced by single beams or also by large-area radiators structured with masks, such as reactive etching systems and plasma-discharge systems, or also in unstructured manner in gas-discharge systems. It is thus possible to produce large-area photon detectors of high efficiency and high sensitivity. Such layers can be used in photovoltaic systems for converting light into electrical energy.

If, through suitable selection of the precursors and starting materials and the conditions of deposition, materials with metastable electron states are produced, then it is possible in this manner to manufacture structured or also unstructured laser materials as starting materials for lasers and narrow-band light sources and to insert them into structures which are of great importance in the field of integrated optics and in circuits for switching and computing with light.

Since the mechanism of conduction is based on the hopping or tunneling of electrons and this process is the fastest for the movement of electrons, these new-type photon detectors made of composite materials represent very high-speed detectors of the kind required in optical communications and signal processing in the GHz range and above.

Computing with light and the controlled emission of light with defined pulse sequences and lengths calls for a high-speed detector in order to produce light with particular properties through controlled high-speed interventions in the emission of the light waves with the aid of deterministic chaos.

Figure 3A:
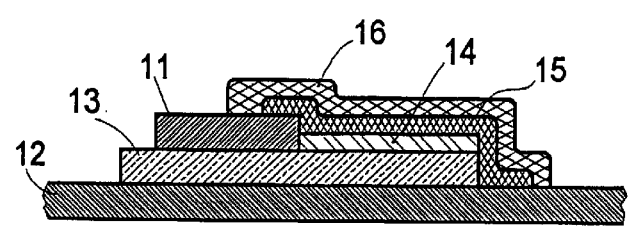
FIG. 3 comprised of FIGS. 3a and 3b, are cross-sectional and top views, respectively, of a photon detector according to the invention, said photon detector, disposed in large numbers in a grid system, serving the purpose of image recording.
Figure 3B:
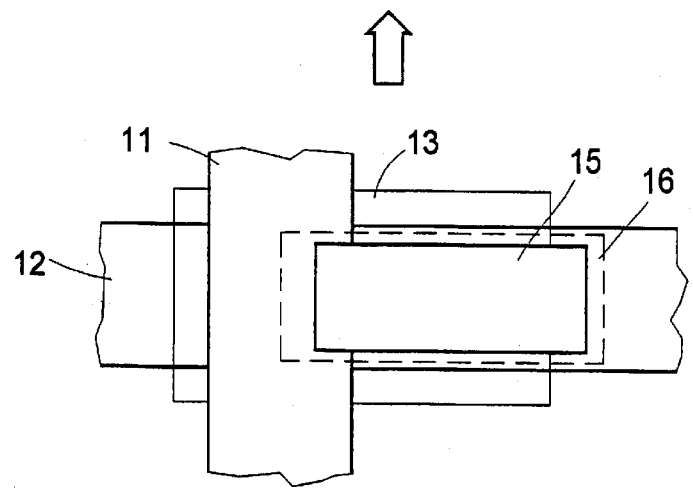

FIGS. 3a and 3b show a photon detector which forms one dot of a large-area sensor of an image-recording device, FIG. 3a being in the form of a cross section and FIG. 3b being a view from the rear. The photon detector is at the point of intersection of two ITO conductors 11, 12, which are separated by an insulator 13. Provided for the purpose of color selection is a dielectric color-filter layer 14 which is applied, as viewed in the direction of incidence of the light (arrow), in front of the light-sensitive layer 15 of nanocrystalline composite material. At the rear, the light-sensitive layer 15 is covered with a dielectric mirror 16 in order to prevent interference from the incidence of light from the rear. The dielectric mirror 16 is indicated merely by a broken line in FIG. 3b in order not to obscure the view of the light-sensitive layer 15.

There has thus been shown and described a novel photon detector and process for making the same which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. In a photon detector wherein material of light-dependent conductivity is disposed between electrically conductive connections, the improvement wherein the material is nanocrystalline composite material comprising segregated metallic conductive single crystals, isolated from each other embedded in a non-conductive matrix, whereby the distance between the single crystals is smaller than the diameter of the single crystals.

2. Photon detector according to claim 1, wherein the single crystals consist of noble metal.

3. Photon detector according to claim 2, wherein the single crystals have a maximum size of four nanometers.

4. Photon detector according to claim 2, wherein the noble metal is selected from the group consisting of platinum and gold.

5. Photon detector according to claim 1, wherein the single crystals comprise a zero-dimensional electron gas with heavily quantized energy gaps.

6. A process for making the photon detector according to claim 1, comprising the steps of applying the nanocrystalline composite material, comprised of segregated metallic conductive single crystals isolated from each other and embedded in a non-conductive matrix, to a substrate by corpuscular-beam-induced deposition, at least one organo-metallic compound being used as starting material, said at least one organo-metallic compound being adsorbed on the surface of the substrate due to its high vapor pressure.

7. A process according to claim 6, wherein the layers of organo-metallic compounds adsorbed on the surface of the substrate with a molecular-beam apparatus in a vacuum are converted into nanocrystalline compounds by high-energy bombardment with corpuscular beams.

8. A process according to claim 7, wherein, during bombardment, the temperature of the substrate is between 0° C. and 100° C.

9. A process according to claim 6, wherein at least one organo-metallic compound contains noble metal.

10. A process according to claim 9, wherein the noble metal is selected from the group consisting of platinum and gold.

11. A process according to claim 6, wherein high-energy electron beams are used as corpuscular beams.

* * * * *